(12) United States Patent
van Bentum et al.

(10) Patent No.: US 6,943,088 B2
(45) Date of Patent: Sep. 13, 2005

(54) METHOD OF MANUFACTURING A TRENCH ISOLATION STRUCTURE FOR A SEMICONDUCTOR DEVICE WITH A DIFFERENT DEGREE OF CORNER ROUNDING

(75) Inventors: Ralf van Bentum, Radebeul (DE); Stephan Kruegel, Boxdorf (DE); Gert Burbach, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/444,191

(22) Filed: May 23, 2003

(65) Prior Publication Data

US 2004/0119135 A1 Jun. 24, 2004

(30) Foreign Application Priority Data

Dec. 19, 2002 (DE) .......................... 102 59 728

(51) Int. Cl.$^7$ ............................................ H01L 21/331
(52) U.S. Cl. ................... 438/353; 438/354; 438/355; 438/359; 438/404; 438/405; 438/424; 438/425; 438/426; 438/427; 438/428; 438/437; 438/444; 438/445; 438/448; 438/452
(58) Field of Search ................. 438/353–355, 438/359, 404–405, 424–428, 437, 444–445, 448, 452

(56) References Cited

U.S. PATENT DOCUMENTS

| | | | |
|---|---|---|---|
| 4,671,970 A | 6/1987 | Keiser et al. ................. 427/93 |
| 5,581,110 A | 12/1996 | Razouk et al. ............. 257/513 |
| 6,057,241 A | 5/2000 | Matsuda et al. ............ 438/689 |
| 6,087,243 A | * 7/2000 | Wang ......................... 438/424 |
| 6,136,664 A | 10/2000 | Economikos et al. ....... 438/431 |
| 6,228,746 B1 | * 5/2001 | Ibok ........................... 438/425 |
| 6,251,734 B1 | 6/2001 | Grivna et al. ............... 438/296 |
| 6,518,146 B1 | 2/2003 | Singh et al. ................ 438/427 |
| 6,733,955 B1 | * 5/2004 | Geiger et al. ............... 430/313 |
| 2002/0020887 A1 | 2/2002 | Lee et al. ................... 257/374 |
| 2002/0070430 A1 | 6/2002 | Oh et al. .................... 257/622 |
| 2002/0086495 A1 | 7/2002 | Yoo et al. ................... 438/423 |

* cited by examiner

*Primary Examiner*—Lynne A. Gurley
(74) *Attorney, Agent, or Firm*—Williams, Morgan & Amerson, P.C.

(57) ABSTRACT

In a trench isolation structure of a semiconductor device, oxide liners are formed within the trenches, wherein a non-oxidizable mask is employed during various oxidation steps, thereby creating different types of liner oxides and thus different types of corner rounding and thus mechanical stress. Therefore, for a specified type of circuit elements, the characteristics of the corresponding isolation trenches may be tailored to achieve an optimum device performance.

30 Claims, 5 Drawing Sheets

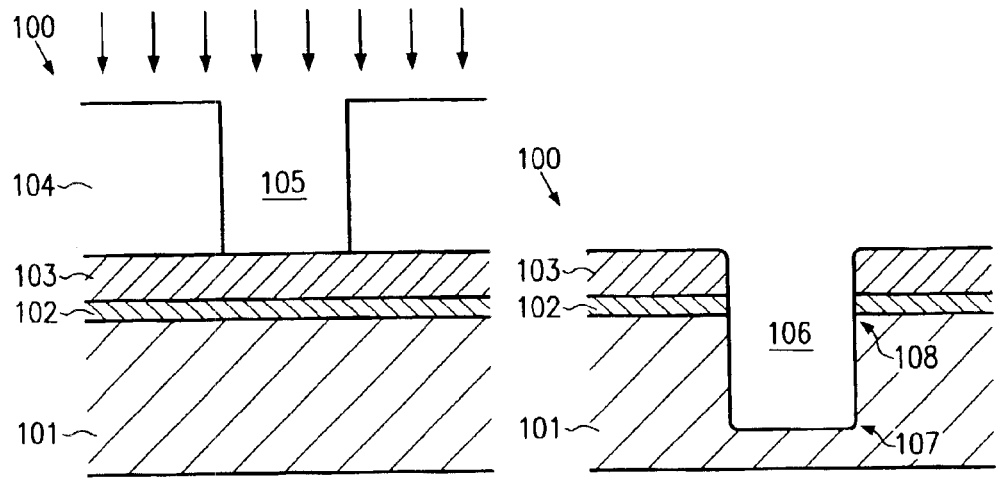
FIG.1a (prior art)
FIG.1b (prior art)
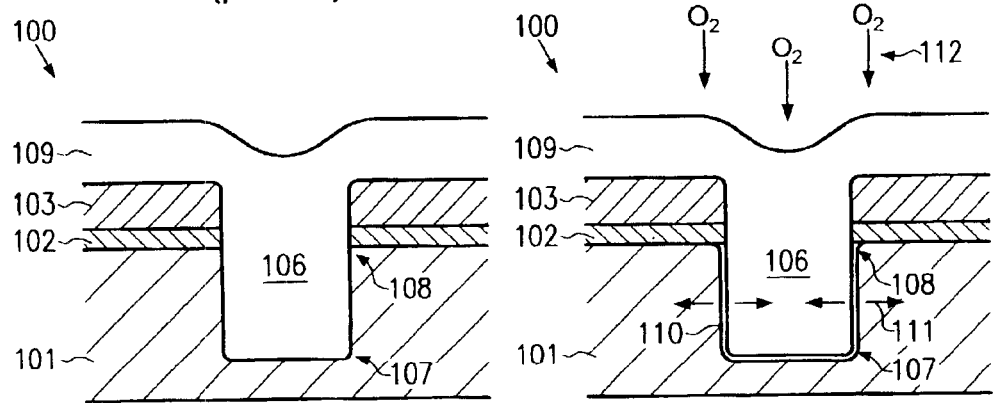
FIG.1c (prior art)
FIG.1d (prior art)
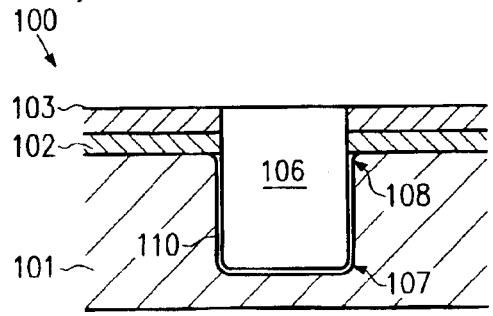
FIG.1e (prior art)

METHOD OF MANUFACTURING A TRENCH ISOLATION STRUCTURE FOR A SEMICONDUCTOR DEVICE WITH A DIFFERENT DEGREE OF CORNER ROUNDING

BACKGROUND OF THE INVENTION

1. Field of the Invention

Generally, the present invention relates to trench isolation structures as usually employed in sophisticated semiconductor devices to electrically insulate neighboring circuit elements from each other, and, more particularly, to techniques allowing the adjustment of characteristics of trench isolation structures, such as corner rounding and residual stress created therein.

2. Description of the Related Art

The ongoing trend in continuously improving the performance of microstructures, such as integrated circuits, not only requires a steady decrease in the feature sizes of the circuit elements but also requires a structure that reliably electrically insulates adjacent circuit elements from each other, wherein the available chip area for manufacturing isolation structures decreases as the feature sizes of the circuit elements are shrunk and the number thereof is increased. For integrated circuits having circuit elements with a feature size of approximately 1 $\mu$m and less, the well-established isolation structures such as the LOCOS (local oxidation of silicon) structure are preferably replaced by less space-consuming and more reliable isolation structures requiring the formation of a vertical trench enclosing a circuit element under consideration. In addition to the reduction of chip area occupied by the trench isolation structure compared to the LOCOS structure, the former structure provides a substantially planar surface for subsequent photolithography processes, thereby significantly improving the resolution of the photolithography process compared to the strongly varying topography of the LOCOS structure. Although the introduction of trench isolation structures into the manufacturing process of integrated circuits significantly enhances device reliability in combination with an increased package density, certain issues arise in manufacturing trench isolation structures, especially when the dimensions of the isolation structure and the associated circuit elements approach the deep sub-micron regime. For dimensions in this order of magnitude, relatively high electrical fields may be created on sharp corners of the trench isolation structures and may therefore affect the operation of the circuit elements, such as field effect transistors and capacitors and the like, finally resulting in an increased leakage current between adjacent circuit elements. The formation of a trench isolation structure generally requires the employment of photolithography and anisotropic etch techniques where, in particular, upper corners of the trenches exhibit, due to the anisotropic etch process, relatively sharp corners that may not be sufficiently rounded by controlling process parameters of the etch process. Therefore, it has become standard practice to form a thermally grown oxide on inner surfaces of the trench so as to provide for an increased radius of curvature, especially of the upper corners of the isolation trenches, wherein, however, an increased thickness of the thermally grown oxide entails additional compressive stress, which in turn may adversely affect device characteristics of the adjacent circuit element.

With reference to FIGS. 1a–1e, the fabrication of a conventional isolation structure is described in more detail.

In FIG. 1a, a semiconductor structure 100 comprises a substrate 101, for example a semiconductor substrate, such as a silicon wafer, or a dielectric substrate bearing a semiconductor layer, such as an SOI (silicon on insulator) substrate. An oxide layer 102 is formed over the substrate 101, for example in the form of a silicon dioxide, followed by a further dielectric layer 103, the material composition of which may be preferably selected so as to serve as a stop layer during a CMP process required in a further advanced manufacturing stage. For example, the layer 103 may be provided as a silicon nitride layer. A resist mask layer 104 is formed over the silicon nitride layer 103 having, formed therein an opening 105, the dimensions of which substantially represent the dimensions of a trench to be formed in the substrate 101. It should be noted that, depending on the type of photolithography technique employed, the resist mask 104 may comprise an anti-reflective coating to enhance the resolution of the photolithography step.

A typical process flow for forming the semiconductor structure 100 may include the following processes. The oxide layer 102 may be formed by a conventional oxidation process or may be deposited by chemical vapor deposition (CVD) techniques from appropriate precursor gases. Next, the silicon nitride layer 103 is deposited, followed by applying a resist layer that is subsequently patterned by a photolithography process to form the opening 105. The lateral dimensions of the opening 105 may depend on the specific design of the circuit to be formed, and may require advanced photolithography techniques when, for instance, feature sizes in the range of approximately 0.2 $\mu$m and less are to be manufactured.

FIG. 1b schematically shows the semiconductor structure 100 with a trench 106 formed in the silicon nitride layer 103, the oxide layer 102 and partially in the substrate 101. The trench 106 has bottom corners or edges 107 which exhibit a rounding or a radius of curvature that depends on the specifics of the anisotropic etch process. On an upper portion of the trench, however, the interface between the oxide layer 102, the substrate 101 and the trench 106, as indicated by 108, will form a relatively sharp corner or edge which may not be easily rounded during the etch process due to the characteristics of the anisotropic etch process. Since sharp corners, e.g., the areas 108, may entail, upon application of a voltage, relatively strong electrical fields in areas adjacent to the trench 106, respective counter measures are usually taken to round the corners 107, and especially the areas 108, so as to minimize any inadvertent impact on a circuit element manufactured near the isolation trench 106, such as a field effect transistor.

Therefore, generally a thermal oxide liner is grown on inner surfaces of the trench 106 in order to provide a larger radius of curvature at the areas 108 at the interface between the dielectric silicon dioxide 102 and the material of the substrate 101. It turns out, however, that growing a thermal oxide within the trench 106 and subsequently depositing a bulk oxide for filling the trench 106 with a dielectric material may result in a reduced quality of the deposited oxide having a higher etch rate adjacent to the thermal liner oxide, thereby possibly leading to the creation of notches during the removal of the silicon nitride layer 103. Consequently, a so-called "late liner" process is frequently employed, in which the bulk oxide is deposited prior to forming the thermal oxide within the trench 106.

FIG. 1c schematically shows the semiconductor structure 100 with a silicon dioxide layer 109 formed over the trench 106 to an extent that the trench 106 is reliably filled at least up to the silicon nitride layer 103. Appropriate deposition techniques, such as chemical vapor deposition with precursor gases TEOS, oxygen and ozone at a temperature range of approximately 350–650° C., may be employed to substantially fill the trench 106 without the creation of any voids therein.

FIG. 1d schematically shows the semiconductor structure 100 with a thermal oxide layer 110 formed on oxidizable inner surfaces of the trench 106, wherein, particularly, the rounding at the areas 108 is significantly increased.

The thermal oxide layer 110 may be formed by exposing the substrate 101 to an oxidizing ambient 112 at an elevated temperature, wherein the dielectric oxide material of the layer 109 is simultaneously densified. By appropriately adjusting the process parameters of the oxidation process, a thickness of the thermal oxide layer 110 may be adjusted in accordance with design requirements. Although an increased thickness of the thermal oxide layer 110 is advantageous in view of increasing the rounding, i.e., the radius of curvature, of the areas 108, it turns out, however, that a mechanical stress 111 is created within the trench 106, since the volume of the thermal oxide created in the layer 110 exceeds the volume of the consumed silicon of the substrate 101. The mechanical stress 111 induced by the growth of the thermal oxide layer 110 may, however, negatively affect the device characteristics of adjacent circuit elements, for example by producing lattice damage in the crystalline structure, and may even increase when high temperature anneal cycles are carried out during the further manufacturing steps. Therefore, a trade-off has to be made regarding the required degree of rounding of the areas 108 and the amount of acceptable mechanical stress 111 created by the thermal oxide layer 110. Since a plurality of different circuit elements having a different sensitivity to undesired electric fields and compressive stress are usually manufactured in an integrated circuit, the isolation trenches 106 represent a targeted compromise for the most sensitive type of circuit elements.

FIG. 1e schematically shows the semiconductor structure 100 after the removal of excess material of the oxide layer 109 by chemical mechanical polishing (CMP). The thickness of the silicon nitride layer 103, acting as a CMP stop layer, is also reduced during the CMP process, wherein the initial thickness of the silicon nitride layer 103 is selected so as to substantially ensure the integrity of the substrate 101 across the entire substrate surface. Subsequently, the residual silicon nitride layer 103 and thereafter the oxide layer 102 may be removed by appropriate wet chemical etch processes (not shown).

In view of the problems resulting from the trade-off in forming the thermal oxide layer 110 that has to be tailored to specific circuit elements, it would, therefore, be highly desirable to provide a technique for the formation of trench isolation structures which allows a higher degree of flexibility in adapting the trench isolation to a specific circuit element.

SUMMARY OF THE INVENTION

Generally, the present invention is directed to a technique that involves selectively forming a thermal liner oxide on oxidizable inner surfaces of a trench structure in that one or more trench structures are covered by an oxygen diffusion barrier in the form of non-oxidizable and/or oxygen-consuming material, wherein one or more other trench structures receive a thermal liner oxide with a specified thickness. The masking of certain trench structures may be carried out in a way that leads to two or more different liner oxide thicknesses, and thus two or more different degrees of corner rounding and mechanical stress, so that the characteristics of the respective isolation structure may be tailored for respective circuit elements.

According to one illustrative embodiment of the present invention, a method of forming a trench isolation structure comprises forming a plurality of trenches in a substrate and covering at least one of the plurality of trenches with an oxygen diffusion barrier layer. A thermal oxide is selectively formed on oxidizable inner surface portions of one or more of the plurality of trenches while covering at least one of the plurality of trenches with the oxygen diffusion barrier layer.

According to another illustrative embodiment of the present invention, a method of controlling the degree of corner rounding of a trench isolation structure in a semiconductor device comprises thermally oxidizing portions of inner surfaces of a first isolation trench filled with an insulating material while covering a second isolation trench filled with the insulating material with a sacrificial oxygen diffusion barrier layer.

In accordance with yet another illustrative embodiment of the present invention, a trench isolation structure in a semiconductor device comprises a plurality of trenches formed in a semiconductive material, wherein each trench has upper corners and bottom corners. An insulating material is filled in each of the trenches, wherein a radius of curvature of the upper corners of at least one of the trenches differs from that of one or more of the residual trenches.

According to a further illustrative embodiment, a trench isolation structure comprises two or more different types of isolation trenches, wherein each type has a specified thickness of a thermal oxide layer formed at an interface between a semiconductor material and an oxide thereof. The specified thicknesses differ from each other.

BRIEF DESCRIPTION OF THE DRAWINGS

The invention may be understood by reference to the following description taken in conjunction with the accompanying drawings, in which like reference numerals identify like elements, and in which:

FIGS. 1a–1e schematically show cross-sectional views of a semiconductor structure containing a conventional isolation trench during various manufacturing stages;

Figure 2A:
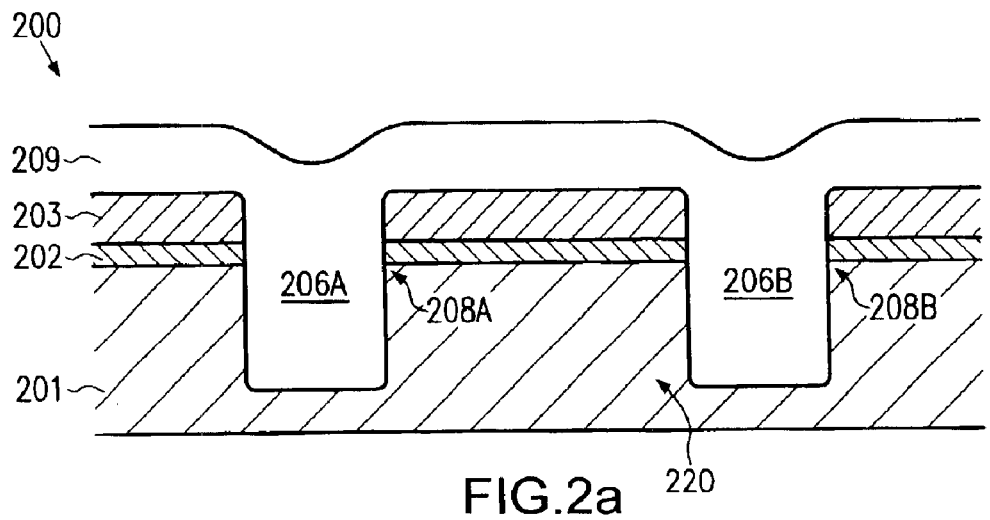
FIGS. 2a–2g schematically show cross-sectional views of an isolation structure having two different types of trench isolations with differently grown thermal oxide layers in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

With reference to FIGS. 2a–2g, illustrative embodiments of the present invention will now be described in more detail. In FIG. 2a, a semiconductor structure 200 comprises a substrate 201, which may be a semiconductor substrate, such as a silicon substrate, that is appropriate for the formation of semiconductor-based circuit elements. For example, the substrate 201 may comprise germanium, gallium arsenide, or various types of II–VI or III–V semiconductors. Moreover, the substrate 201 is representative of any appropriate substrate that includes at least a layer of semiconductive material in which circuit elements may be formed. In particular, the substrate 201 may represent an SOI substrate in which a silicon layer is commonly provided above an insulating layer, typically a silicon dioxide layer, which is also referred to as buried oxide. Since the vast majority of integrated circuits are manufactured on the basis of silicon, in the following, the substrate 201 will be referred to as a silicon substrate, which forms upon exposure to an oxidizing ambient silicon dioxide. The semiconductor structure 200 further comprises a trench isolation structure 220, which in the present example is represented by a first trench 206a and a second trench 206b, which may differ in their dimensions in accordance with design requirements. It should be appreciated that the trenches 206a, 206b may typically represent isolation trenches at very different areas of the substrate 201 or, as in the example shown in FIG. 2a, may represent isolation trenches related to adjacent circuit elements formed therebetween. An oxide layer 202 is formed above the substrate 201 followed by a further dielectric layer 203 having characteristics that allow the layer 203 to serve as a stop layer in a subsequent CMP process. The layer 203 may, for example, be comprised of silicon nitride. A layer of a dielectric oxide material 209 is formed above the layer 203 so as to substantially completely fill the trenches 206a, 206b. The trenches 206a, 206b have upper corner areas indicated by 208a, 208b, respectively.

Regarding a typical process flow for forming the semiconductor structure 200 as shown in FIG. 2a, similar processes may be employed as already explained with reference to FIGS. 1a–1c. In the case where the substrate 201 is to represent an SOI substrate, the trenches 206a, 206b may extend down to and possibly into the buried oxide layer (not shown). After the deposition of the dielectric layer 209, in one embodiment, a thermal treatment may be carried out in an inert ambient containing, for example, nitrogen and/or argon and the like, to densify the dielectric material 209. A temperature of the thermal treatment may range from approximately 700–1100° C.

Figure 2B:
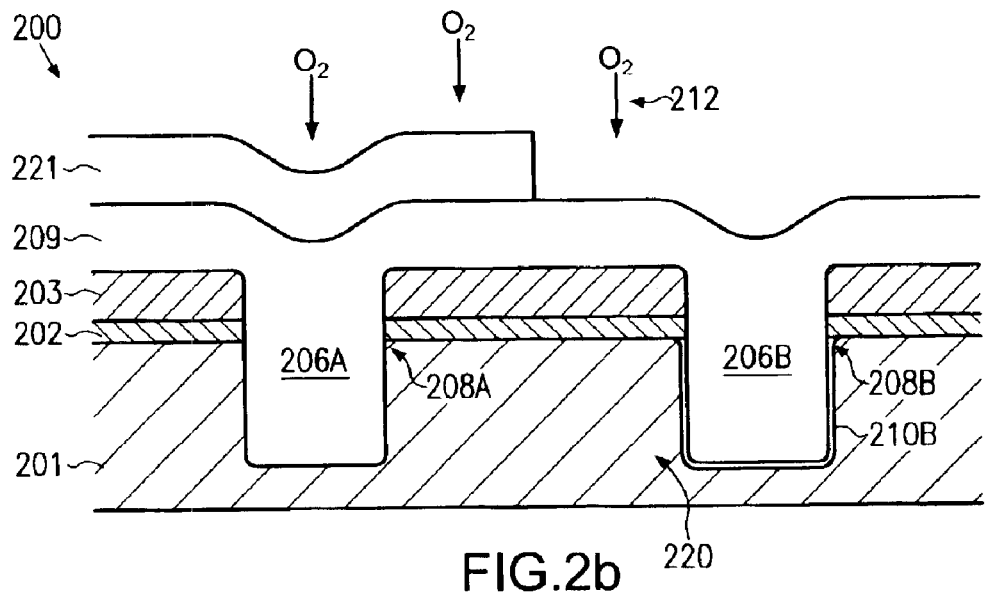

FIG. 2b schematically shows the semiconductor structure 200 with a sacrificial mask layer 221 acting as an oxygen diffusion barrier and formed over a portion of the trench isolation structure 220 such that the trench 206a is covered by the mask layer 221. The mask layer 221 may be comprised of a non-oxidizable material, i.e., of a material that substantially avoids oxygen donation and/or diffusion to an adjacent material layer when exposed to an oxidizing ambient 202 at elevated temperatures. For example, the mask layer 221 may be comprised of silicon nitride. Another appropriate material for forming the mask layer 221 may include silicon oxynitride (SiON). In a further illustrative embodiment, the mask layer 221 is substantially comprised of an oxidizable material, such as polysilicon, which substantially consumes the oxygen penetrating the mask layer 221, thereby substantially avoiding the diffusion of oxygen into the underlying trench isolation structure 220. The thickness of the mask layer 221, if comprised of an oxidizable material, is then selected so as to substantially prevent oxygen diffusion during the entire exposure to an oxidizing ambient 212. Since the oxidation process of a plurality of materials is well understood, an appropriate thickness of the mask layer 221 may be readily determined in advance.

In forming the mask layer 221 over the trench isolation structure 220, well-established photolithography and etch techniques may be employed, wherein these techniques are not critical, since the lateral dimensions of the mask layer 221 may vary as long as the trench 206a is substantially completely covered and the trench 206b is substantially entirely exposed. During the exposure to the oxidizing ambient 212, a thermal oxide layer 210b forms on oxidizable inner surface portions of the trench 206b and leads to an increased rounding, i.e., an increased radius of curvature, at the areas 208b. The process parameters, such as temperature, duration, oxygen concentration and the like, in establishing the oxidizing ambient 212 may be adjusted to obtain a required thickness and, thus, a required degree of corner rounding at the areas 208b such that, in combination with a second step of oxidizing the trench 206b, as will be described with reference to FIG. 2c, a final degree of corner rounding is achieved. Since the growth rate of thermal oxide in silicon is well known, the thickness of and the corner rounding at the areas 208b may be readily controlled by selecting the duration of the oxidization, once the structural characteristics of the structure 200, i.e., temperature, oxygen concentration, pressure and the like, are set. For semiconductor materials other than silicon, the growth rate for a specified structure may be determined by experiment.

Figure 2C:
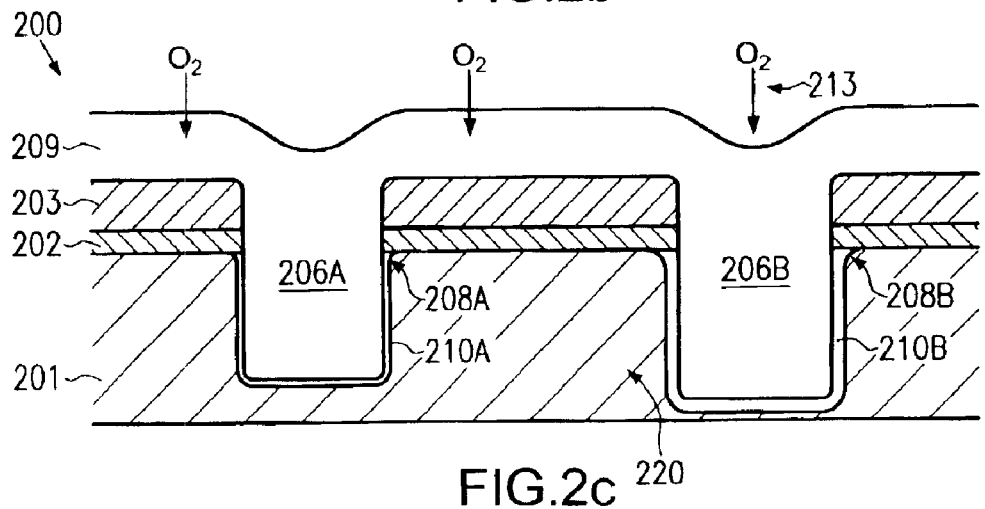

FIG. 2c schematically shows the semiconductor structure 200 with the sacrificial mask layer 221 removed. The semiconductor structure 200 is exposed to a further oxidizing ambient 213 to produce a thermal oxide layer 210a within the trench 206a, while further increasing the thickness of the thermal oxide layer 210b within the trench 206b. As noted above, the process parameters used during exposing the semiconductor structure 200 to the oxidizing ambients 212, 213 are selected such that the thermal oxide layer 210a meets the requirements for the circuit element related therewith. For example, merely a low amount of mechanical stress is created by the thermal oxide layer 210a, while at the same time a required thick thermal oxide layer 210b leads to a reduced field strength due to the increased radius of curvature of the areas 208b. For example, a thickness of the thermal oxide layer 210a may be adjusted to a thickness in the range of approximately 1–30 nm, whereas a thickness of the thermal oxide layer 210b may exceed that of the thermal oxide layer 210a by a predefined amount that may be adjusted by correspondingly selecting the process parameters of the oxidizing ambient 213.

Figure 2D:
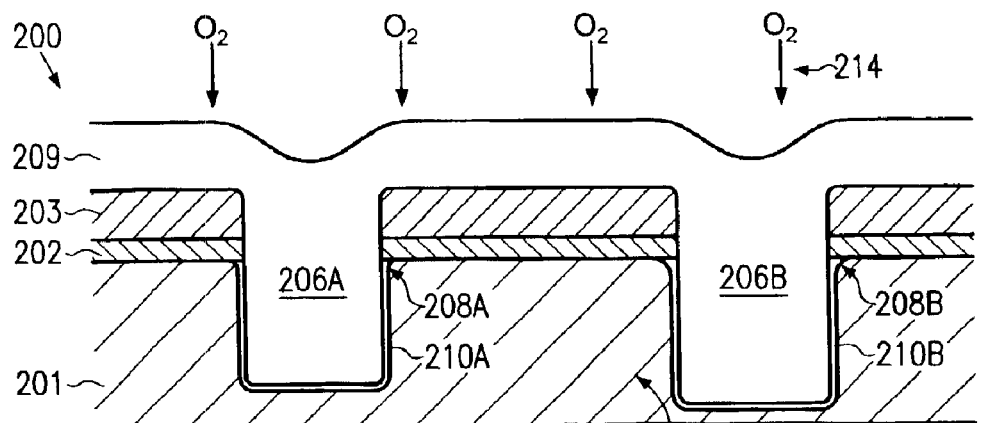

FIG. 2d schematically shows a further illustrative embodiment wherein, starting from the semiconductor structure 200 as shown in FIG. 2a, alternatively or in addition to a heat treatment in an inert ambient, an oxidizing ambient 214 is established to provide substantially identical thermal oxide layers 210a, 210b within the trenches 206a, 206b. During exposing the semiconductor structure 200 to the oxidizing ambient 214, the dielectric oxide layer 209 may simultaneously be densified so that a preceding heat treatment may be obsolete or a duration thereof may be significantly shortened. The process parameters of the oxidizing ambient 214 are selected such that a thickness of the thermal oxide layer 210b, and thus a degree of corner rounding of the areas 208b, conform to the specified circuit element to be formed adjacent to the isolation trench 206b.

Figure 2E:
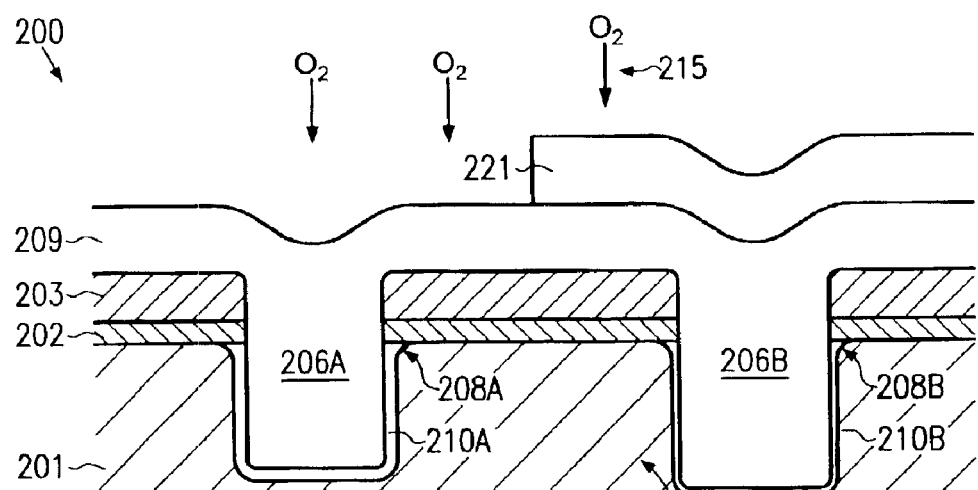

FIG. 2e schematically shows the semiconductor structure 200 after the formation of the sacrificial non-oxidizable mask layer 221 that covers the trench 206b, while exposing the trench 206a to a further oxidizing ambient 215. Thus, the thickness of the thermal oxide layer 210a is increased until a specified degree of corner rounding at the areas 208a is obtained. Principally, the sequence shown in FIGS. 2d and 2e is timely inverted to the sequence shown in FIGS. 2b and 2c.

Figure 2F:
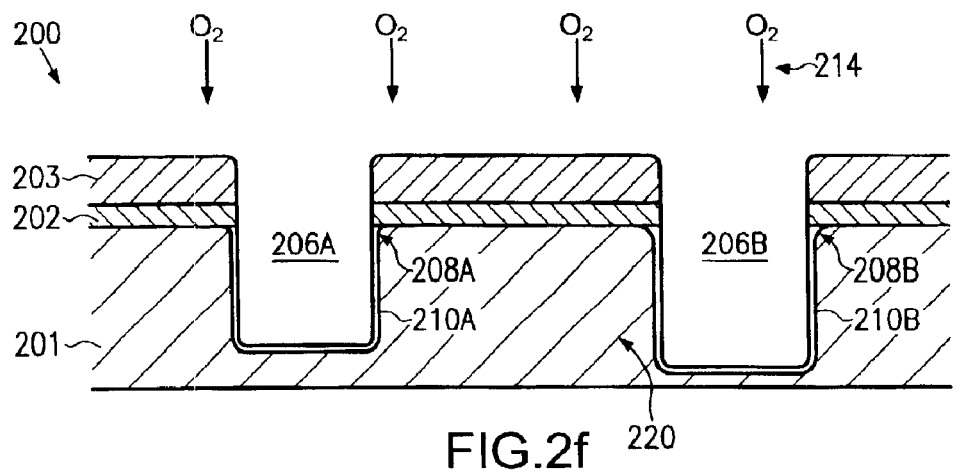

FIG. 2f schematically shows the semiconductor structure 200 in accordance with a further illustrative embodiment of the present invention. The semiconductor structure 200 comprises the same components and parts as already shown and described in FIG. 2d, except for the dielectric oxide layer 209. The semiconductor structure 200 is exposed to the oxidizing ambient 214 and the thermal oxide layers 210a, 210b of substantially identical characteristics are formed within the trenches 206a, 206b. This approach may be selected if concerns exist regarding the placement of the dielectric oxide layer 209 (not shown in FIG. 2f) directly on a crystal lattice that may be damaged by preceding implantation steps without any thermal oxide "curing" and oxide densification. Subsequently, the dielectric oxide layer 209 may be deposited so as to fill the trenches 206a and 206b.

Figure 2G:
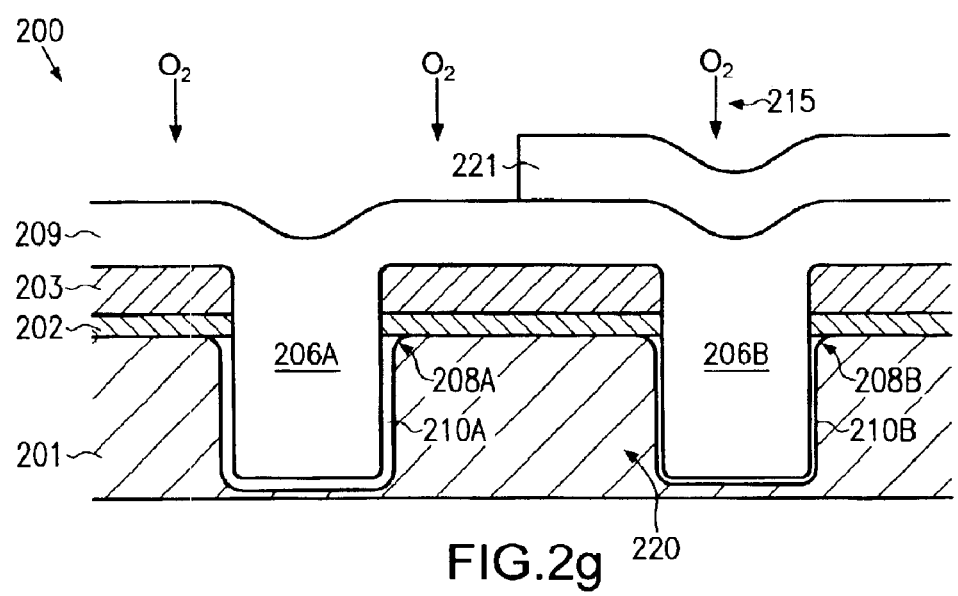

FIG. 2g schematically shows the semiconductor structure 200 after deposition of the dielectric oxide layer 209 and the formation of the sacrificial mask layer 221 covering the trench 206b. The semiconductor structure 200 is exposed to the oxidizing ambient 215 such that the thermal oxide layer 210a is increased to a required final thickness, and thus a final required corner rounding, of the areas 208a. It should be noted that the process parameters of the oxidizing ambient 214 (FIG. 2f) may be selected so as to obtain the required characteristics of the thermal oxide layer 210b without any further oxidization of the trench 206b, or an additional mask may be formed or, alternatively, an oxidation step may be carried out without any mask after the deposition of the dielectric oxide layer 209 so as to achieve the required characteristics of the thermal oxide layer 210b. That is, in some applications, it may be advantageous to provide a relatively thin thermal oxide layer 210a, 210b within the trenches 206a, 206b and then deposit the dielectric oxide layer 209 and complete the thickness of the thermal oxide layer 210b in accordance with a "late liner" process, thereby substantially avoiding the above-identified possible drawbacks of the "late liner" process.

Figure 3A:
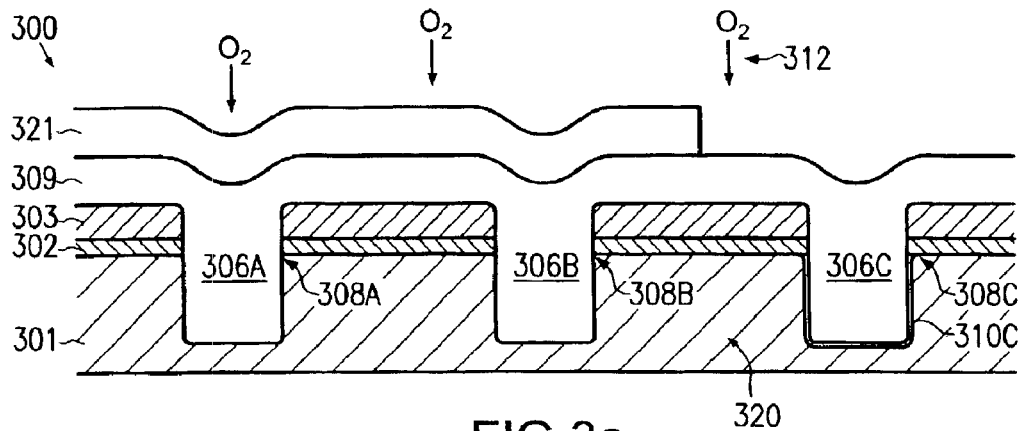
FIGS. 3a–3c schematically show cross-sectional views of an isolation structure having a plurality of isolation trenches, each of which includes a differently grown thermal oxide in accordance with still other illustrative embodiments of the present invention.
Figure 3B:
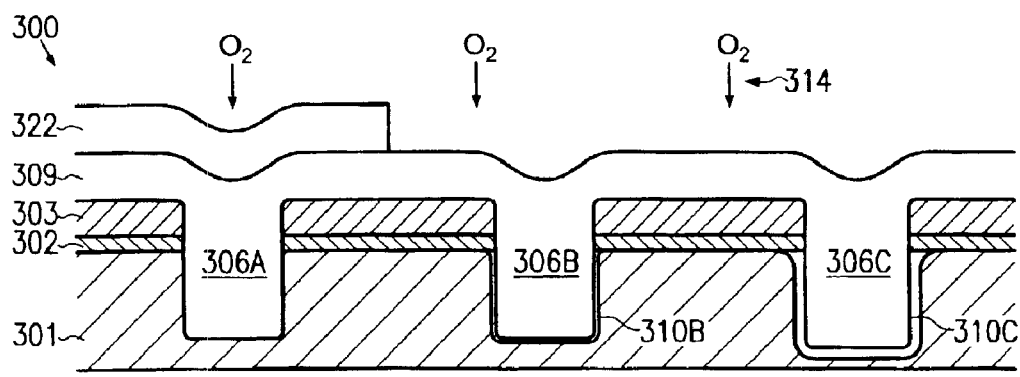
Figure 3C:
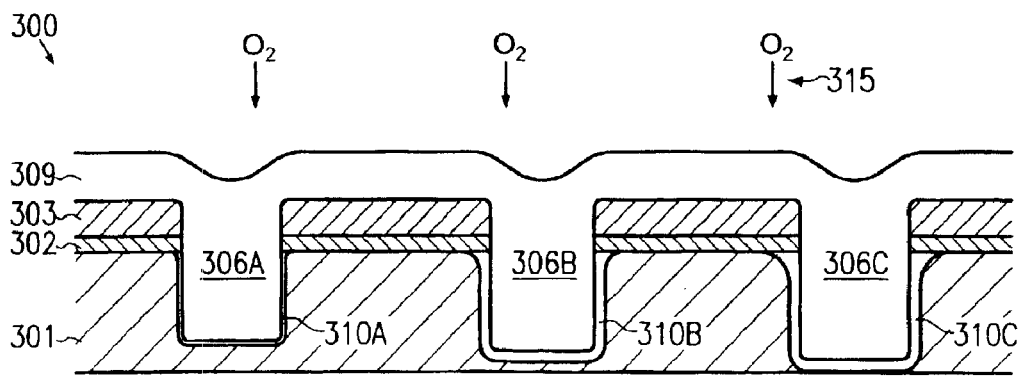

With reference to FIGS. 3a–3c, further illustrative embodiments of the present invention will now be described. In FIG. 3a, a semiconductor structure 300 comprises a trench isolation structure 320, which in the present example is represented by three isolation trenches 306a, 306b, 306c which are formed in a substrate 301. The number of trenches is illustrative only and the isolation structure 320 may comprise an arbitrary number of isolation trenches that are to receive different types of grown oxide layers. An oxide layer 302 followed by a top layer 303 and a dielectric oxide layer 309 are formed over the substrate 301. Moreover, a sacrificial mask layer 321 is formed over the dielectric oxide layer 309 so as to cover the trenches 306a, 306b and expose the trench 306c. Regarding the type of material of the various components of the semiconductor structure 300 as well as a process flow for forming the structure as shown in FIG. 3a, the same criteria apply as already pointed out with reference to FIGS. 1a–1e and 2a–2g. The semiconductor structure 300 is exposed to an oxidizing ambient 312 to create a thermal oxide layer 310c within the trench 306c.

FIG. 3b shows the semiconductor structure 300 with the sacrificial mask layer 321 removed and with a second sacrificial mask layer 322 formed over the structure 300 so as to expose the trenches 306b, 306c while covering the trench 306a. The structure 300 is exposed to an oxidizing ambient 314 to form a thermal oxide layer 310b within the trench 306b while increasing a thickness of the thermal oxide layer 310c.

Finally, FIG. 3c shows the structure 300 with the trenches 306a, 306b, 306c exposed to an oxidizing ambient 315 to form a thermal oxide layer 310a within the trench 306a, while increasing the thickness of the thermal oxide layers 310b, 310c. Regarding the selection of the process parameters for the various oxidizing ambients 312, 314, 315, the same criteria apply as previously explained with reference to the preceding illustrative embodiments. Moreover, the sequence shown in FIGS. 3a–3c may be inverted so that the trenches 306a, 306b, 306c are initially unmasked and receive a substantially identical thermal oxide layer. The initial oxidation may be preceded by a heat treatment for densification of the dielectric oxide layer 309 as is described earlier. Subsequently, the trench 306a is masked (FIG. 3b) and thereafter trenches 306a, 306b are masked (FIG. 3a) to obtain the required different thicknesses, and thus corner rounding, at the areas 308a, 308b, 308c of the trench isolation structure 320. Moreover, any of the process sequences described with reference to FIGS. 2a–2e may also be employed with the embodiments described with reference to FIGS. 3a–3c. That is, in some embodiments, a thermal oxide layer of required thickness may be formed prior to the deposition of the dielectric oxide layer 309. Thereafter any of the above-described sequences in masking one or more of the trenches 306a, 306b, 306c may be applied to form different types of isolation trenches.

As a result, the present invention enables the formation of trench isolation structures with different types of thermally grown oxide liners in different isolation trenches by using well-established deposition methods and non-critical photolithography techniques to provide electrical and mechanical characteristics of the isolation trenches, which are specifically adapted to the related circuit elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a trench isolation structure, the method comprising:
   forming a plurality of trenches in a substrate;
   filling said plurality of trenches with an insulating material;
   after filling said plurality of trenches, covering at least one of said plurality of trenches with an oxygen diffusion barrier layer;
   after filling said plurality of trenches, selectively forming a thermal oxide on oxidizable inner surface portions of one or more of said plurality of trenches while covering at least one of said plurality of trenches with said oxygen diffusion barrier layer; and
   removing said oxygen diffusion barrier layer covering said at least one trench, and thermally oxidizing oxidizable inner surface portions of said previously covered trench.

2. The method of claim 1, further comprising heat treating said substrate in an inert ambient to densify said insulating material.

3. The method of claim 1, wherein said oxygen diffusion barrier layer comprises a non-oxidizable material.

4. The method of claim 3, wherein said non-oxidizable material comprises at least one of silicon nitride and silicon oxynitride.

5. The method of claim 1, wherein said oxygen diffusion barrier layer comprises an oxidizable material.

6. The method of claim 5, wherein a thickness of said oxygen diffusion barrier layer is selected to substantially avoid a complete oxidation of said oxidizable material during the formation of said thermal oxide.

7. A method of forming a trench isolation structure, the method comprising:
   forming a plurality of trenches in a substrate;
   covering at least one of said plurality of trenches with an oxygen diffusion barrier layer;
   selectively forming a thermal oxide on oxidizable inner surface portions of one or more of said plurality of trenches while covering at least one of said plurality of trenches with said oxygen diffusion barrier layer; and
   removing said oxygen diffusion barrier layer covering said at least one trench, and thermally oxidizing oxidizable inner surface portions of said previously covered trench.

8. The method of claim 7, wherein said oxygen diffusion barrier layer comprises a non-oxidizable material.

9. The method of claim 8, wherein said non-oxidizable material comprises at least one of silicon nitride and silicon oxynitride.

10. The method of claim 7, wherein said oxygen diffusion barrier layer comprises an oxidizable material.

11. The method of claim 10, wherein a thickness of said oxygen diffusion barrier layer is selected to substantially avoid a complete oxidation of said oxidizable material during the formation of said thermal oxide.

12. A method of forming a trench isolation structure, the method comprising:
   forming a plurality of trenches in a substrate;
   covering at least one of said plurality of trenches with a first oxygen diffusion barrier layer;
   selectively forming a thermal oxide on oxidizable inner surface portions of one or more of said plurality of trenches while covering at least one of said plurality of trenches with said first oxygen diffusion barrier layer; and
   removing said first oxygen diffusion barrier layer and covering at least one of said one or more trenches with a non-oxidizable second oxygen diffusion barrier layer to substantially prevent further oxide growth on the sidewalls of said at least one trench covered by the second oxygen diffusion barrier layer.

13. The method of claim 12, wherein said first oxygen diffusion barrier layer comprises a non-oxidizable material.

14. The method of claim 12, wherein said first oxygen diffusion barrier layer comprises an oxidizable material.

15. The method of claim 12, wherein a thickness of said first oxygen diffusion barrier layer is selected to substantially avoid a complete oxidation of said oxidizable material during the formation of said thermal oxide.

16. A method of controlling a degree of corner rounding of a trench isolation structure in a semiconductor device, the method comprising:
   thermally oxidizing portions of inner surfaces of a first isolation trench filled with an insulating material while covering a second isolation trench filled with an insulating material with a sacrificial oxygen diffusion barrier layer; and
   removing said oxygen diffusion barrier layer and forming a thermal oxide layer within said first and second trenches after thermally oxidizing portions of said first trench.

17. The method of claim 16, further comprising forming a thermal oxide layer within said first and second trenches prior to thermally oxidizing portions of said first trench.

18. The method of claim 16, further comprising heat treating said trench isolation structure in a non-oxidizing ambient to densify the dielectric oxide in said first and second trenches.

19. The method of claim 16, further comprising heat treating said trench isolation structure at least for a certain time interval in an oxidizing ambient to densify said insulating material and to form a thermal oxide within said first and second trenches.

20. The method of claim 16, wherein said oxygen diffusion barrier layer comprises a non-oxidizable material.

21. The method of claim 16, wherein said oxygen diffusion barrier layer comprises an oxidizable material.

22. The method of claim 21, wherein a thickness of said oxygen diffusion barrier layer is selected to substantially avoid a complete oxidation of said oxidizable material during the formation of said thermal oxide.

23. A method of controlling a degree of corner rounding of a trench isolation structure in a semiconductor device, the method comprising:

thermally oxidizing portions of inner surfaces of a first isolation trench filled with an insulating material while covering a second isolation trench filled with an insulating material with a sacrificial oxygen diffusion barrier layer; and removing said sacrificial oxygen diffusion barrier layer, forming a second oxygen diffusion barrier layer to cover said first trench and thermally oxidizing surface portions of said second trench.

24. The method of claim 23, further comprising forming a thermal oxide layer within said first and second trenches prior to thermally oxidizing portions of said first trench.

25. The method of claim 23, comprising heat treating said trench isolation structure in a non-oxidizing ambient to densify the dielectric oxide in said first and second trenches.

26. The method of claim 23, comprising heat treating said trench isolation structure at least for a certain time interval in an oxidizing ambient to densify said insulating material and to form a thermal oxide within said first and second trenches.

27. The method of claim 23, wherein a total amount of exposure to an oxidizing ambient for each of said first and second trenches is controlled so as to obtain a first thickness of said thermal oxide layer in said first trench and a second thickness of said thermal oxide layer in said second trench in conformity with a first and second design thickness.

28. The method of claim 23, wherein said sacrificial oxygen diffusion barrier layer comprises a non-oxidizable material.

29. The method of claim 23, wherein said sacrificial oxygen diffusion barrier layer comprises an oxidizable material.

30. A method of forming a trench isolation structure, the method comprising:

forming a plurality of trenches in a substrate;

filling said plurality of trenches with an insulating material;

after filling said plurality of trenches, covering at least one of said plurality of trenches with a first oxygen diffusion barrier layer;

after filling said plurality of trenches, selectively forming a thermal oxide on oxidizable inner surface portions of one or more of said plurality of trenches while covering at least one of said plurality of trenches with said first oxygen diffusion barrier layer; and removing said first oxygen diffusion barrier layer and covering at least one of said one or more trenches with a non-oxidizable second oxygen diffusion barrier layer to substantially prevent further oxide growth on the sidewalls of said at least one trench covered by the second oxygen diffusion barrier layer.

* * * * *

UNITED STATES PATENT AND TRADEMARK OFFICE
CERTIFICATE OF CORRECTION

PATENT NO. : 6,943,088 B2
DATED : September 13, 2005
INVENTOR(S) : Ralf van Bentum et al.

It is certified that error appears in the above-identified patent and that said Letters Patent is hereby corrected as shown below:

Column 11,
Lines 13 and 16, before "comprising" insert -- further --.

Signed and Sealed this

Fifteenth Day of November, 2005

JON W. DUDAS
*Director of the United States Patent and Trademark Office*